United States Patent
Kuehlwein

(10) Patent No.: US 7,450,329 B2
(45) Date of Patent: Nov. 11, 2008

(54) METHOD TO VARY SYMMETRY AND COUPLING IN SYMMETRICAL WRITE DRIVERS FOR DISK DRIVER PREAMPLIFIERS

(75) Inventor: Jeremy Robert Kuehlwein, Woodbury, MN (US)

(73) Assignee: Texas Instruments Incorporated, Dallas, TX (US)

(*) Notice: Subject to any disclaimer, the term of this patent is extended or adjusted under 35 U.S.C. 154(b) by 349 days.

(21) Appl. No.: 10/932,240

(22) Filed: Sep. 1, 2004

(65) Prior Publication Data

US 2006/0044662 A1   Mar. 2, 2006

(51) Int. Cl.
  *G11B 5/02*   (2006.01)
(52) U.S. Cl. ........................................ 360/68
(58) Field of Classification Search .......... None
  See application file for complete search history.

(56) References Cited

U.S. PATENT DOCUMENTS

| | | | |
|---|---|---|---|
| 6,246,533 B1* | 6/2001 | Davis et al. .................... | 360/68 |
| 7,006,313 B2* | 2/2006 | Ngo ............................. | 360/46 |
| 7,068,454 B2* | 6/2006 | Kuehlwein et al. ............ | 360/67 |
| 2002/0176198 A1* | 11/2002 | Cyrusian et al. ............... | 360/68 |
| 2004/0196581 A1* | 10/2004 | VanEaton et al. ............. | 360/46 |
| 2004/0196582 A1* | 10/2004 | VanEaton et al. ............. | 360/46 |
| 2005/0007686 A1* | 1/2005 | Bloodworth et al. .......... | 360/67 |
| 2005/0152206 A1* | 7/2005 | Barnett et al. .......... | 365/230.06 |
| 2006/0012902 A1* | 1/2006 | Sharifi ......................... | 360/46 |

* cited by examiner

*Primary Examiner*—Andrea Wellington
*Assistant Examiner*—Dan I Davidson
(74) *Attorney, Agent, or Firm*—Tum Thach; Wade J. Brady, III; Frederick J. Telecky, Jr.

(57) ABSTRACT

The present invention achieves technical advantages as a preamplifier write driver (10) having a varying common-mode output voltage. This varying common-mode output voltage also adjusts the derivative of the common-mode voltage, which is proportional to the amount of current coupled onto the MR head through parasitic capacitance. Currents of a first circuit (Q0,Q3) and a second circuit (Q1,Q2) are matched to overcome process variations and modeling errors. A pair of transresistance amplifiers (16) are driven by control lines (14) to achieve these matched currents.

10 Claims, 1 Drawing Sheet

METHOD TO VARY SYMMETRY AND COUPLING IN SYMMETRICAL WRITE DRIVERS FOR DISK DRIVER PREAMPLIFIERS

FIELD OF THE INVENTION

The present invention is generally related to hard disk drives, and more particularly to preamplifier write drivers.

BACKGROUND OF THE INVENTION

A recent requirement from all of the disk drive manufacturers is that the preamplifier write driver must now be symmetric. This means that the common-mode output voltage of the write driver must stay around ground over a high frequency pattern. This is driven by head reliability as the new generation of magnetoresistive (MR) heads are much more sensitive to accumulation of differential and single-ended voltages, and the primary mechanism for this damage is capacitive coupling from the write driver.

Symmetrical writers have been developed to address this problem. While traditional symmetrical writers do reduce the problem substantially compared to traditional write driver architectures, there are several factors that prevent this problem from being minimized even more to the fullest potential. First, the IC process components within the preamplifier are subject to wide variation. In addition, modeling of the entire system (preamplifier write driver, write head, transmission line from write driver to write head) is very complex and subject to errors, both internal and external to the preamplifier. These IC process variations and modeling errors can cause significant deviation from the performance expected through simulation, resulting in excessive asymmetry and coupling to the MR head.

SUMMARY OF THE INVENTION

The present invention achieves technical advantages as a preamplifier write driver having a varying common-mode output voltage. This varying common-mode output voltage also adjusts the derivative of the common-mode voltage, which is proportional to the amount of current coupled onto the MR head through parasitic capacitance. This parasitic capacitance is located mainly along the transmission line and within the read/write head structure itself.

In one embodiment of the invention, the bottom write driver output devices of the write driver preamplifier are controllably and selectively driven to nominally match and follow the top write driver output devices. In another embodiment of the invention, the top output devices are driven to match and follow the bottom output devices. In both embodiments, top and bottom output device currents are matched to overcome process variations and modeling errors.

The write driver varies the drive current to the controlled write driver output devices in a programmable fashion through a serial interface. The invention also provides the ability to either increase or decrease the drive to the controlled output devices, which enables the current of the controlled output device to be set in such a way as to counteract effects of process variations and modeling errors in either direction. Advantageously, the drive currents from the top and bottom output devices can be made nearly identical even in the presence of these variations and errors. This advantageously avoids deviations from expected performance as the common-mode voltage is kept close to GND, and the amount of current coupling to the MR head is minimized.

DETAILED DESCRIPTION OF THE PREFERRED EMBODIMENT

Figure 1:
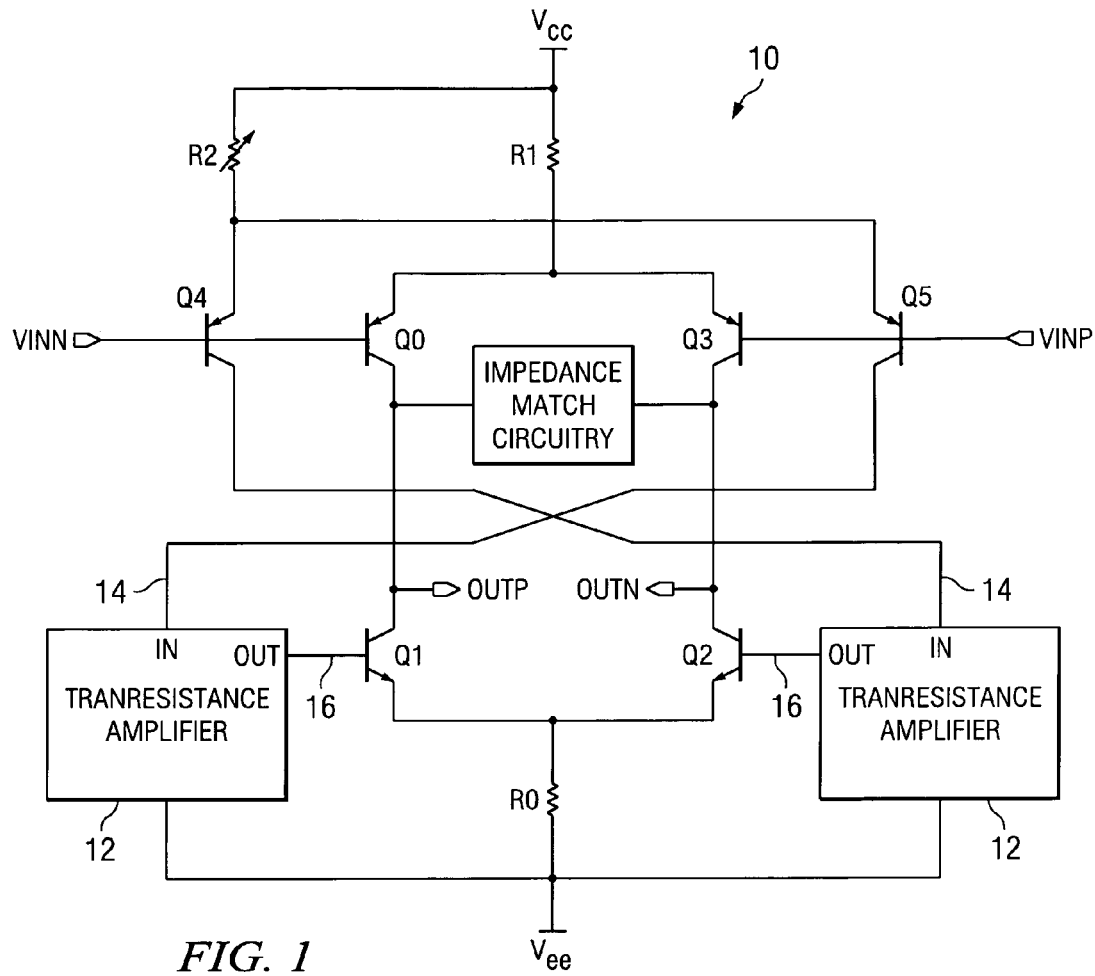
FIG. 1 is an electrical schematic of one embodiment of the invention.

FIG. 1 shows a preamplier write driver 10 according to the present invention in a symmetrical write driver application. The outputs of the write driver 10 are OUTP and OUTN, which are driven by transistors Q0-Q3 and some impedance match circuitry forming an H-bridge driver circuit. Transistors Q0 and Q3 are the top output devices, and transistors Q1 and Q2 are the bottom output devices. Transistors Q1 and Q2 are driven by respective transresistance amplifiers 12, which each receive an input current at respective input 14 and drive an output voltage at respective output 16. The transresistance amplifiers 12 are driven by transistors Q4 and Q5. It is through this path from transistors Q4, Q5 to the respective transresistance amplifiers 12 to transistors Q1, Q2 that the bottom output devices, transistors Q1, Q2, are driven to match and follow the top output devices, transistors Q0, Q3.

As mentioned earlier, the principles of the first embodiment described here applies in a second embodiment (opposite situation) where the top output devices transistors Q0, Q3 are driven to match and follow the bottom output devices, transistors Q1, Q2.

For power savings, the current output from transistors Q4 and Q5 to respective inputs 14 can be reduced compared to the current output Q0 and Q3, with the transresistance amplifiers 12 providing gain such that the currents of transistors Q1 and Q2 are identical to the currents of transistors Q0 and Q3. Transistors Q4, Q0, Q3, and Q5 are driven by the write data input voltages VINN and VINP.

In one aspect of the invention, a key component in FIG. 1 is the variable resistor R2. By increasing the resistance value of resistor R2, the drive current to the bottom output devices, transistors Q1 and Q2 is reduced. By reducing the value of resistor R2, the drive current to the bottom output devices, transistors Q1 and Q2, is increased. The present invention advantageously compensates for and counteracts the effects of IC process variations and modeling errors allowing the drive currents from the top output devices (Q0,Q3) and the bottom output devices (Q1,Q2) to be nearly identical, even in the presence of these variations and errors. This, in turn, keeps the common-mode voltage close to GND, and minimizes the amount of coupling to the MR head.

Figure 2:
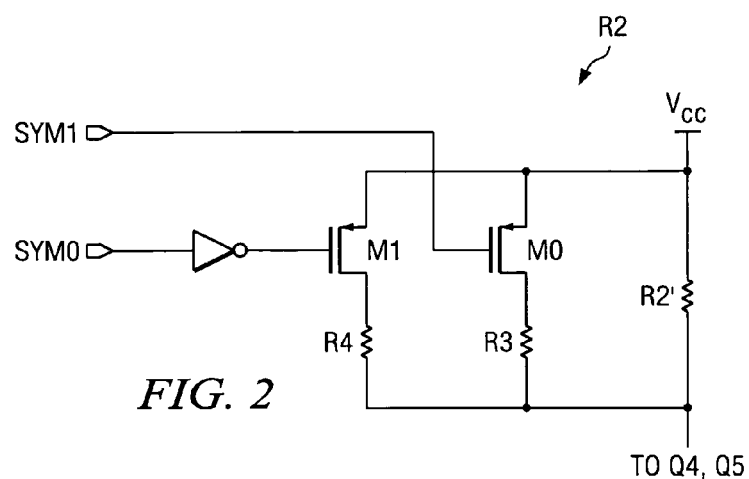
FIG. 2 is an electrical schematic of one embodiment of digitally controlled resistors adapted to select a resistance of resistor R2.

FIG. 2 shows one implementation used to make resistor R2 variable. This is just one possible implementation. SYM1, SYM0 are CMOS digital signals from a preamplifier serial interface (not shown, and these 2 bits of programmability provide 4 different resistance values for resistor R2. This number of bits is arbitrary and could be set higher if desired for more selectivity of the resistor R2 resistance value. The programmable bits SYM1, SYM0 control the respective PMOS devices transistors M0 and M1, which are in series with resistors R3 and R4, respectively. If a high voltage is placed on transistor M0's gate (or M1), then transistor M0 (or M1) is turned off and resistor R3 (or R4) is not placed in parallel with resistor R2', leaving the overall resistance unchanged. When a low voltage is placed on transistor M0's gate (or M1), then transistor M0 (or M1) is turned on which places resistor R3 (or R4) in parallel with resistor R2'. This selective enabling of transistors M0 and M1 changes the overall resistance of the resistor R2 and provides the ability for selecting variable resistance. The default power-up value of bits SYM1, SYM0 is low. Thus, upon resistor power up, transistor M1 is off and transistor M0 is on, which places resistor R3 in parallel with resistor R2. Having the nominal default resistance include a programmable path that is on allows the overall resistance to be varied in either direction should the common-mode voltage or coupling need to be adjusted due to process variations or modeling errors. With transistor M1 off in the default state, turning transistor M0 off by programming bit SYM1 high increases the overall resistance. With transistor M0 on in the default state, turning transistor M1 on by programming bit SYM0 high decreases the overall resistance. The last remaining state is when both bits SYM0 and SYM1 are programmed high. The values of resistors R4 and R3 can be chosen such that one has a greater effect than the other, providing an even spread of 4 different possible programmable values.

There are 3 states that each write data input voltage will cycle through continuously. These states are off, overshoot (pulse), and settled DC write data. When one input write data voltage is in the off state, the other will go through the overshoot and settled DC write data states. The point is that there is AC performance as well as DC performance, with the AC performance having more importance since this is when the coupling to the MR head will occur. The invention described here affects both AC and DC performance, since both AC (overshoot) and DC (settled) current flow through variable resistor R2 and transistors Q4 and Q5 to drive the bottom output devices.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

I claim:

1. A hard disk drive comprising:
   an H-bridge circuit having:
      a first circuit receiving a differential signal input;
      a second circuit comprising a pair of transresistance amplifiers for providing a differential signal output adapted to drive a hard disk drive head; and
      a driver circuit varying a common-mode voltage of the differential signal output;
   wherein the first circuit comprises a pair of transistors being cross-coupled to the pair of transresistance amplifiers; and
   wherein the driver circuit drives the first circuit to produce a current matching a current provided by the second circuit.

2. The hard disk drive as specified in claim 1 wherein the driver circuit drives the first circuit such that the currents of the first and second circuits are matched even in the presence of process variations of the H-bridge circuit.

3. A hard disk drive comprising:
   an H-bridge circuit having:
      a first circuit including a first pair of transistors for receiving a differential signal input;
      a second circuit including a second pair of transistors and a pair of transresistance amplifiers for providing a differential signal output adapted to drive a hard disk drive head; and
      a driver circuit varying common-mode voltage of the differential signal output,
   wherein the first circuit comprises a third pair of transistors being in parallel with the first pair of transistors and being cross-coupled to the pair of transresistance amplifiers.

4. The hard disk drive as specified in claim 3 wherein the first circuit and second circuit each comprise a pair of transistors.

5. The hard disk drive as specified in claim 3 wherein the driver circuit selectively drives the transresistance amplifiers to vary the common-mode voltage of the differential signal output.

6. The hard disk drive as specified in claim 3 wherein the driver circuit comprises a component having a variable value.

7. The hard disk drive as specified in claim 6 wherein the component comprises a variable resistor.

8. The hard disk drive as specified in claim 6 wherein the component is adapted to have a variable value as a function of a control signal.

9. The hard disk drive as specified in claim 8 wherein the component is adapted to receive the control signal from a serial interface.

10. The hard disk drive as specified in claim 6 wherein the component value has a default value upon power-up being between a lower and upper possible value of the component.

* * * * *